Sept. 11, 1951

C. C. HOAGLAND 2,567,845

COUNTER CIRCUIT

Filed April 12, 1945

2 Sheets-Sheet 1

INVENTOR.

Clifford C. Hoagland

Howson & Howson
Attys.

Sept. 11, 1951 C. C. HOAGLAND 2,567,845

COUNTER CIRCUIT

Filed April 12, 1945 2 Sheets-Sheet 2

INVENTOR.
Clifford C. Hoagland
BY
Howson & Howson
Attys.

Patented Sept. 11, 1951

2,567,845

UNITED STATES PATENT OFFICE 2,567,845

COUNTER CIRCUIT

Clifford C. Hoagland, Jenkintown, Pa., assignor, by mesne assignments, to Philco Corporation, Philadelphia, Pa., a corporation of Pennsylvania Application April 12, 1945, Serial No. 588,031

14 Claims. (Cl. 250—27)

The present invention relates to a counting circuit or frequency divider, and more particularly to a feed back step counter circuit of this type.

Heretofore various circuits have been used as frequency dividers or as counting circuits. Such circuits have various different applications ranging from simple frequency division to control uses such as a frequency divider for pulses or as a control circuit for a certain number of operations or cycles of operations.

Such circuits have various different applications, and in the lower frequency range such circuits have been used for cycle control as for example in thyratron operations. The circuit components bear a certain relation to the accuracy of the circuit, particularly as the count increases. At the higher frequencies various means have been devised which tend to reduce the required tolerance of the circuit components, but relatively little has been done at the lower frequencies as for example in the audio frequency range. When it is necessary to count down by an integer which contains no small common factors, the tolerance in components becomes unsatisfactorily close.

It, therefore, would be desirable to provide a frequency divider or counting circuit for use at audio frequencies where the tolerance of the components is not exceptionally close and where the circuit, however, may be used when the count is fairly high.

It, therefore, is an object of the present invention to provide an improved frequency divider or step counter circuit where the tolerance of the components is comparatively low.

It is a further object of the present invention to provide an improved feed back step counter circuit wherein a constant or increasing voltage gradient for each pulse is obtained as the count is increased.

It is a further object of the present invention to provide an improved step counter circuit wherein a step voltage wave form is obtained with substantially constant voltage steps.

It is a still further object of the present invention to provide an improved step counter or frequency divider circuit having a high degree of accuracy at the higher counts while employing components of conventional tolerance limitations.

Other and further objects of the present invention will become apparent by reference to the following description taken in connection with the accompanying drawings wherein Figure 1 is a simple circuit diagram illustrating a step toward the solution of the problem with which the present invention is concerned;

Figure 1:
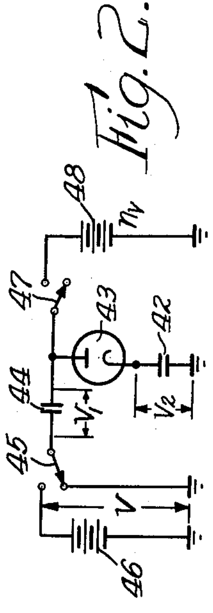

Reference may now be had to Figure 1 which shows a capacitor 42 connected between ground and the cathode of a diode 43. The anode of the diode is connected through a capacitor 44 to a switch 45 having two terminals one of which is connected to ground and the other of which is connected to a source of potential 46. The anode of the diode 43 is also connected to another switch 47 one terminal of which is not connected to any other circuit and the other terminal of which is connected to a source of potential 48. In this circuit it will be assumed that the capacitor 44 is much greater in value than the capacitor 42. The switch 45 is moved from the position shown to connect the source of potential 46 to the capacitor 44 and the switch 47 remains at the position shown. Under this condition $v_2$ is approximately equal to V, whereupon a charge of +Q appears in the cathode of the diode 43, and a charge of −Q appears at the anode. The switch 45 is then moved to the grounded contact whereupon capacitor 44 assumes a potential $v_1$ which is negative with respect to ground, the value of which is determined by the ratio of the capacitors 44 to 42, but the potential $v_2$ remains approximately equal to V. If the switch 45 is again moved to the upper contact nothing will occur for the diode 43 will not pass any further current since there is no difference in potential across its elements. The switch 45 therefore is moved to the position originally shown and the switch 47 is moved to the upper contact. The potential across the capacitor 42 which is $v_2$ remains unchanged, but the capacitor 44 is now charged to a potential $v_1$ (approximately equal to V) by potential 48, where $n=1$.

If now the switch 47 is returned to its original position and then switch 45 is moved to the upper position, $v_1$ will be equal to 2V and the diode 43 will pass current to charge the capacitor 42 up to a potential $v_2$ approximately equal to 2V. From this it is apparent that if the potential on the anode of the diode is raised in equal steps simultaneously with the cathode of the diode, the voltage across the capacitor 42 will go up in equal steps which are equal to V.

Figure 2:
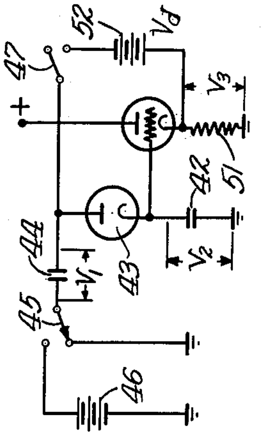
Figure 2 is a simplified circuit diagram illustrating the basic principle of the present invention.

Reference may now be had to Figure 2 which is a modification of that circuit shown in Figure 1 and for simplicity in comparing the two circuits, similar components have been given similar reference characters. A cathode follower tube 49 has its anode connected to a suitable source of potential, and its cathode is connected through a bias resistor 51 to ground. The cathode is also connected to a biasing source of voltage 52. The grid of the cathode follower tube 49 is directly connected to the cathode of the diode 43. When the switch 45 is moved to the upper contact, the capacitor 42 is charged to $v_2$ approximately equal to V. This causes the potential across the resistor 51 to go to $v_3$. The potential $v_3$ greater than $v_2$ by the bias of the tube. If the switch 45 is moved to the grounded contact and $v_3$ were supplied directly to the plate of the diode, $v_2$ would be increased thus resulting in increase of $v_3$ which would continue until $v_3$ approached B+. If, however, a potential $v_d$ greater than $v_3 - v_2$ which is a source of potential 52, then the switch 47 may be connected thereto so that $v_1$ less than or equal to $v_3 - v_d$ which is less than or equal to $v_2$ which is approximately equal to V.

Figures 3, 4:
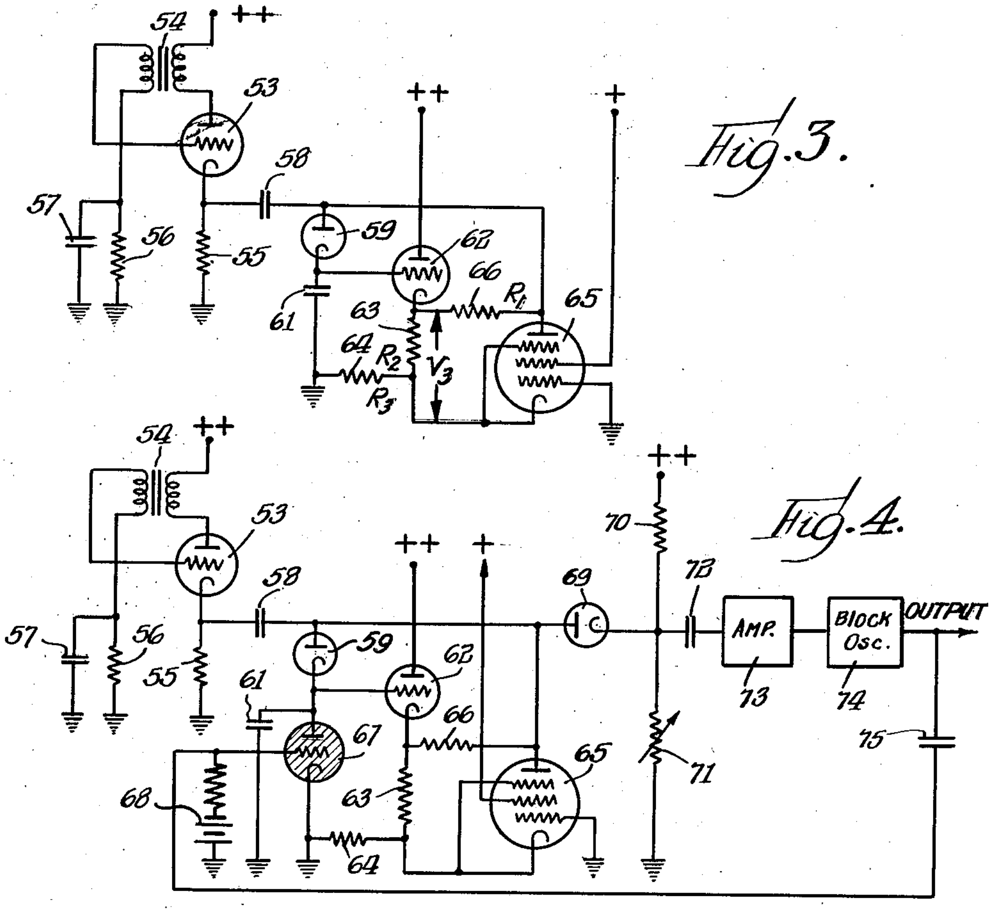
Figure 3 is a circuit diagram embodying the present invention.
Figure 4 is a further embodiment of the present invention.

This circuit now fulfills the conditions shown in Figure 1. The source of potential 52 of Figure 2 and the action of the switch 47 may be obtained in an electrical circuit such as shown in Figure 3. In this figure a triode vacuum tube 53 is provided with its anode connected through a transformer 54 to a suitable source of potential. The cathode of the vacuum tube 53 is connected through a load resistor 55 to ground. The grid of the vacuum tube 53 is connected through the feed back winding of the transformer 54 and a grid resistor 56 to ground. A grid capacitor 57 is also connected to ground. The cathode of the blocking oscillator 53 is coupled through a capacitor 58 to the anode of a diode 59 which has its cathode connected to a capacitor 61 which in turn is connected to ground. It will be seen that the elements 58, 59 and 61 correspond respectively to the elements 44, 43 and 42 of Figs. 1 and 2 and function in the same manner. The juncture between the capacitor 61 and the cathode of the diode 59 is connected to the grid of a cathode follower vacuum tube 62 having its anode connected to a suitable source of potential. The cathode of the cathode follower tube 62 is connected through resistors 63 and 64 to ground. A pentode 65 has its anode connected through a resistor 66 to the cathode of the cathode follower tube 62 and the anode of the pentode 65 is also connected to the anode of the diode 59. The cathode and one of the grids of the pentode 65 are connected to the common junction between the resistors 63 and 64. One of the grids is connected to ground and the other remaining grid is connected to a suitable source of biasing voltage. The circuit shown is substantially the equivalent to that shown in Figure 2. While a pentode is essentially a constant current device, the pentode as connected in Figure 3 is arranged so that when $v_3$ increases, the current is decreased because of the increased bias provided by the voltage divider $$\frac{R_3}{R_2+R_3}$$

where $R_2$ is the resistor 63 and $R_3$ the resistor 64.

In this circuit the current through the pentode is so controlled that the drop through the plate resistor $R_1$ or resistor 66 closely approximates the bias of the triode cathode follower tube 62. This may be stated in another manner by stating that the drop of the resistor $R_1$ is equal to $v_d$ of the previous Figure 2. By this arrangement the blocking oscillator will supply pulses to charge the capacitor 61 and the resultant voltages supplied by this circuit appearing at the anode of the pentode 65 will be equal voltage steps. Thus the voltage appearing across the diode 59 will increase by equal voltage steps the potential across the capacitor 61 so that the only provision now necessary is to provide a recycling circuit to periodically discharge the capacitor 61 when the desired number of steps or counts have been obtained.

Figure 4 shows the additions which may be made to the circuit shown in Figure 3 in order to provide for the periodic recycling operation. Connected in parallel with the capacitor 61 is a normally non-conductive tube 67 which permits the capacitor 61 to be charged. The normally non-conductive tube 67 may be a tube of any suitable type which remains non-conductive until a predetermined potential is applied to the control electrode thereof to render the tube conductive. The tube should have a great current carrying capacity so as to rapidly discharge the capacitor 61. A gas filled tube such as a thyratron has been found suitable for this purpose. The grid of the thyratron 67 is biased by a biasing source of voltage 68 so as to maintain the tube non-conductive for a certain range of potential appearing at the anode of the tube. The remaining portions of the circuit are the same as that shown in Figure 3, and hence have corresponding reference characters. The anode of the diode 59 is connected to the anode of another diode 69 having its cathode connected to a voltage divider formed of a fixed resistor 70 and an adjustable resistor 71. This junction between the resistors 70 and 71 is connected to a coupling capacitor 72 so as to supply energy to an amplifier 73 which in turn supplies energy to a blocking oscillator 74. The energy from the blocking oscillator is used for control purposes in accordance with the particular application to be made of the counting or frequency divider circuit. A portion of the output voltage of the blocking oscillator 74 is fed through a coupling capacitor 75 to the grid of the thyratron 67 so as to render this tube conductive. The diode 69 is biased by the voltage divider comprising the resistors 70 and 71 so that the voltage applied to its anode up to the value of $n$ pulses supplied to the capacitor 61 is insufficient to render the diode operative. After $n$ pulses have been supplied to the capacitor 61 the next succeeding pulse will not charge the capacitor 61 but will be transmitted through the diode 69 to the coupling capacitor 72 to actuate the amplifier which amplifies the pulse and operates the blocking oscillator 74 to transmit a control pulse. A portion of the control pulse is fed back to the grid of the thyratron 67 to render this tube conductive which rapidly discharges the capacitor 61. When the energy stored by the capacitor 61 has been dissipated, the thyratron 67 again becomes non-conductive thus permitting another cycle of charging the capacitor 61 to occur.

Figure 5:
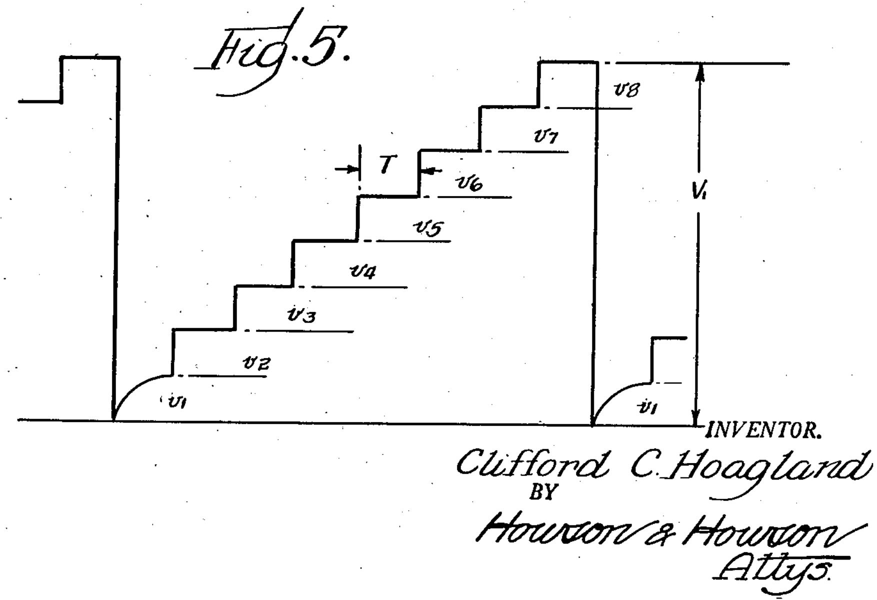
Figure 5 is a graphical representation illustrating the operation in accordance with the present invention.

The arrangement shown in Figure 4, therefore, provides an arrangement which produces the operation diagrammatically illustrated in Figure 5 from which it will be seen that the capacitor 61 is charged by substantially equal increments or voltage steps from $v_1$ to $v_8$ and that the pulse following $v_8$ renders the thyratron 67 conductive so as to rapidly reduce the charge across the capacitor 61 to substantially zero, and during the remaining period of that pulse the capacitor 61 is charged up to the value of $v_1$.

By way of example, in one physical embodiment of the circuit arrangement shown in Fig. 4, the principal elements were characterized as follows.

Figure 6:
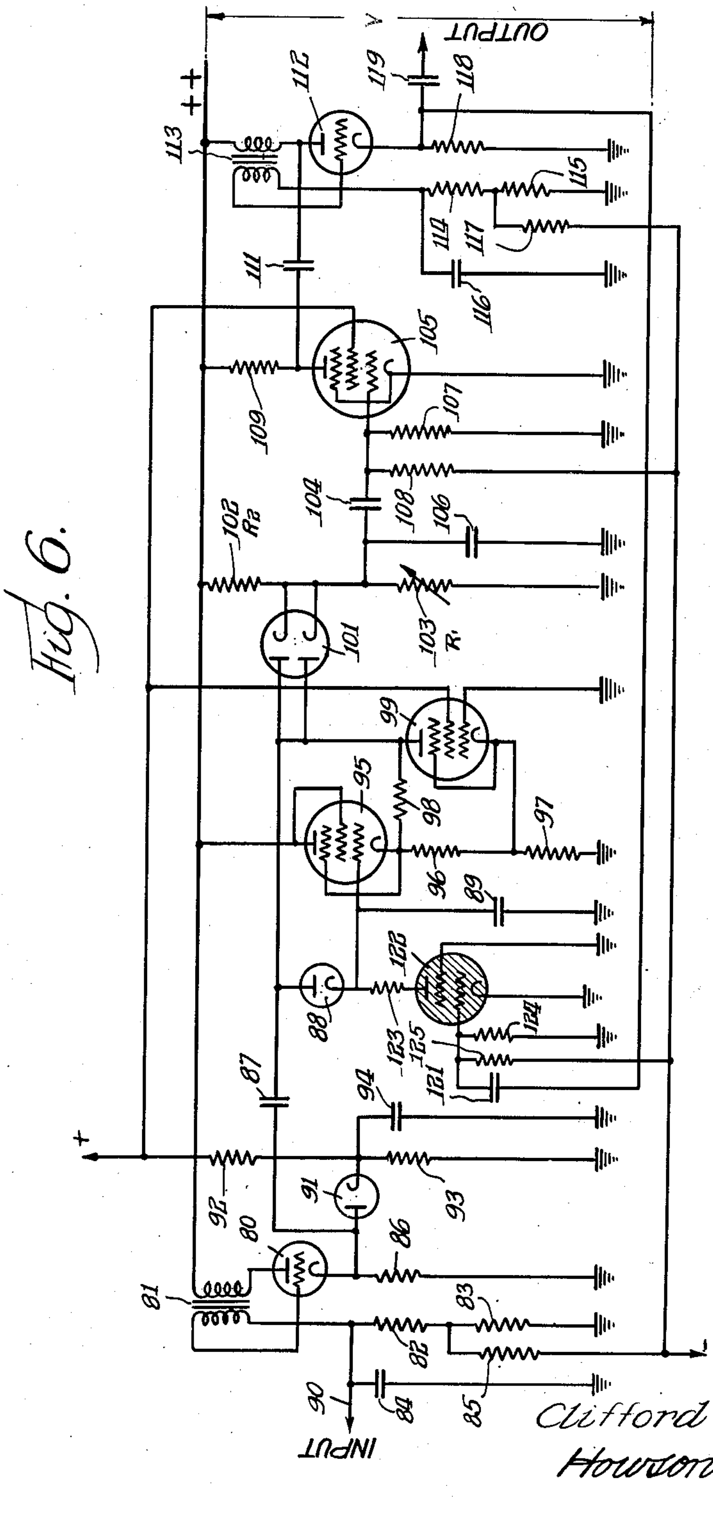
Figure 6 is a complete circuit diagram of an arrangement constructed in accordance with the present invention as applied in actual operation.

Tube 53—type 6C4
Diodes 59 and 69—type 6AL5
Tubes 62 and 65—type 6AG5
Tube 67—type 2D21
Resistor 55—75 ohms
Capacitor 58—.01 microfarad
Capacitor 61—500 micro-microfarads
Resistor 63—68,000 ohms
Resistor 64—1000 ohms
Resistor 66—4700 ohms
Resistor 70—680 ohms
Capacitor 72—.001 microfarad
Voltage applied at each dotted terminal—300 volts
Voltage applied at arrowhead bias terminal—150 volts If desired the circuit arrangement shown in Figure 4 may be provided with certain refinements so as to obtain an even greater accuracy in the magnitude of succeeding individual charges supplied to the capacitor. Such refinements, however, are not essential except where a higher degree of accuracy is required. The circuit shown in Figure 6 therefore includes a blocking oscillator utilizing the triode vacuum tube 80 having its anode connected through a common winding of a transformer 81 to a suitable source of anode potential. The feed back winding of the transformer 81 is connected to the grid of the vacuum tube 80 and the other terminal of the transformer is connected to grid resistors 82 and 83. The resistors are by-passed by a capacitor 84 and the connection between the capacitor 84 and the resistor 82 leads to a source of control voltage. The junction between the resistors 82 and 83 is connected to a resistor 85 which in turn is connected to a conductor leading to a suitable source of negative bias potential. The cathode of the vacuum tube 80 is loaded by the resistor 86 connected to ground. The cathode of the blocking oscillator tube 80 is connected through a coupling capacitor 87 to the anode of a diode 88 having its cathode connected to a capacitor 89 which is to be charged by increments in accordance with the pulses provided by the blocking oscillator 80.

In order that the pulses supplied by the blocking oscillator 80 shall be of equal amplitude at all times there is provided a diode 91 having its anode connected to the cathode of a blocking oscillator tube 80. The cathode of the diode 91 is connected to a voltage divider including the resistors 92 and 93, the latter being connected to ground. The resistor 92 is connected to an intermediate point on the source of anode potential. The cathode resistor 93 is by-passed by a capacitor 94. The values of these resistors are so selected that any potential beyond a certain maximum potential to be supplied by the blocking oscillator 80 is by-passed to ground so that the increments of potential supplied through the coupling capacitor 87 to the diode 88 for charging the capacitor 89 are uniform. The cathode of the diode 88 is connected to the control grid of a cathode follower tube 95 which in this instance has been shown as comprising a pentode having its screen grid and its anode connected to the same source of potential which supplies potential to the blocking oscillator tube 80. The suppressor grid and the cathode of the vacuum tube 95 are connected to the series connected resistors 96 and 97, the latter resistor being connected to ground. Another resistor 98 is also connected to the cathode of the cathode follower tube 95 and to the anode of another pentode tube 99 which has its cathode connected to the junction between the resistors 96 and 97.

The screen grid of this latter tube 99 is connected to the intermediate source of potential to which the diode resistor 92 was connected. The grid of the pentode 99 is connected directly to ground. The anode of the pentode 99 is connected back to the anode of the diode 88 so that as the capacitor 89 is charged by increments of voltage the anode of the diode 88 is also raised by equal increments so that the voltage across the capacitor 89 will rise in equal steps. The anodes of the vacuum tubes 88 and 99 are connected to the anode of a diode 101 which corresponds to the diode 69 in Figure 4. In the present representation the diode 101 has been shown as having two cathodes and two anodes since it has been found convenient to utilize a tube of the 6AL5 type. It might at this time be mentioned that one-half of a 6AL5 is used for the diode 88 and the other half is used for the diode 91. The cathodes of the diode 101 are connected to a voltage divider comprising the fixed resistor 102 and the adjustable resistor 103 which is connected to ground. The resistor 102 is connected to a high source of anode potential which supplies potential to the anodes of the vacuum tubes 81 and 95. The intermediate point between the resistors 102 and 103 is connected to a coupling capacitor 104 which in turn is connected to the grid of an amplifier tube 105. The adjustable resistor 103 is by-passed by a capacitor 106. The grid of the amplifier tube 105 is provided with a grounded grid resistor 107 and suitable bias potential is supplied to the grid through a series resistor 108 connected to the conductor leading to the source of negative bias potential. The suppressor grid and the cathode of the pentode 105 are connected to ground.

The screen grid is connected to the intermediate source of potential previously mentioned. The anode of the vacuum tube 105 is connected through a coupling or anode resistor 109 to the higher source of anode potential. The anode of the pentode 105 is connected to a coupling capacitor 111 which is connected to the anode of a blocking oscillator tube 112. The anode of the blocking oscillator tube 112 is connected through one winding of a transformer 113 to a suitable source of anode potential. The feed back winding of the transformer 113 is connected to the grid of the vacuum tube 112 and to one end of the series resistors 114 and 115, the latter resistor being connected to ground. These resistors are by-passed by a capacitor 116 and the intermediate point between the resistors 114 and 115 is connected through a series resistor 117 to the source of negative bias potential. The cathode of the blocking oscillator vacuum tube 112 is connected through a cathode resistor 118 to ground. The cathode of the blocking oscillator tube is coupled through a coupling capacitor 119 to a conductor which leads to the apparatus to be controlled. The cathode of the vacuum tube 112 is coupled by a capacitor 121 to the control grid of a normally non-conductive tube 122 which preferably is in the form of a tetrode thyratron. The anode of the thyratron 122 is connected through a current limitor resistor 123 to the cathode of the diode 88 which in turn is connected to the high potential side of the capacitor 89.

The screen grid of the thyratron 122 is connected to ground and the cathode of this tube is also connected to ground. The grid of the thyratron 122 is provided with a grounded grid resistor 124 and the grid is biased through a series resistor 125 which in turn is connected to the source of negative bias potential.

In operation a suitable source of synchronizing voltage is applied to the conductor 90 which is connected to the common junction between the capacitor 84, the resistor 82, and the transformer 81. This causes the blocking oscillator 81 to become conductive and to supply a pulse of voltage through the coupling capacitor 87 and the diode 88 to the capacitor 89. Successive pulses supplied in synchronism by the blocking oscillator including the vacuum tube 80 charge the capacitor 89 up to a certain predetermined value. When this predetermined value has been reached, the next succeeding pulse fails to increase the charge across the capacitor 89 but passes through the diode 101 and passes on to the amplifier including the tube 105 which in turn energizes through the coupling capacitor 111 the blocking oscillator including the vacuum tube 112. The blocking oscillator 112 transmits its pulse through the coupling capacitor 119 to the apparatus to be controlled. A portion of the energy of this pulse, however, is transmitted through the coupling capacitor 121 to the control grid of the thyratron 122 which thereupon becomes conductive and rapidly discharges the capacitor 89. The circuit thereupon repeats the cycle just described.

As has been previously stated, the purpose of the diode 91 is to cut off any excess voltage supplied by the pulses obtained from the blocking oscillator 80 so that the pulses supplied to the diode 88 for charging the capacitor 89 by increments are of equal magnitude. The diode 88, however, would be unable to supply or increase the charge of the capacitor 89 by equal increments were it not for the action of the cathode follower tube 95 and the pentode voltage tube 99. The cathode follower tube 95 is energized in accordance with the potential appearing across the charging capacitor 89 so that accordingly a voltage proportional thereto is developed across the resistor 96 which supplies the potential to the uniquely connected pentode tube 99. This voltage across the resistor 96 therefore permits current to flow through the pentode 99 so that a voltage drop appears across the resistor 98 which voltage increases the effective voltage at the anode of the diode 88 accordingly. Thus as the cathode potential of the diode 88 is elevated by successive increments of charge across the capacitor 89, the anode potential likewise increases. Hence the diode 88 throughout that portion of its operating cycle is capable of increasing the potential across the charging capacitor 89.

In order to simplify the explanation of the present invention and its operation, it has been necessary of course to assume a certain operation, or a certain number of counts. For example such counts as have been shown in the illustrated curve may have been counts within the audio frequency limits. The number of counts may be controlled as will become apparent to those skilled in the art. It is also possible to vary the height of each step by which the capacitor is charged. The controlling factor for the step height is the maximum voltage which may be applied to the cathode follower grid without drawing grid current. If this voltage is denoted as $E_{max}$ then the step height may have been a value of $$\frac{E_{max}}{n}$$

where $n$ is the desired count. Thus there has been determined the step height in this circuit and from this may be determined the tolerance represented thereby.

The circuit is obviously advantageous for a high count, and when it is assumed that the value $$\frac{v_d}{V}$$

is not too low, it can be used with tolerances for the components comparable to the tolerances of other count circuits commonly used for relatively low counts.

While for the purpose of illustrating and describing the present invention certain preferred embodiments have been shown, it is to be understood that such variations and modification of the circuit arrangements and the various instrumentalities employed therein may be made as may be commensurate with the spirit and scope of the invention set forth.

This invention is hereby claimed as follows:

1. The combination comprising a source of periodic peaked voltage, an energy storage circuit including a capacitor and a diode vaccum tube connected in series, means connecting the anode of said diode vacuum tube to said source of voltage, a rapid discharging circuit for said capacitor including a grid-controlled gas filled tube, a cathode follower tube having its input electrode connected to the cathode of said diode vacuum tube, a vacuum tube arranged to be energized from said cathode follower tube for developing a potential substantially equal to the potential appearing across said capacitor, and means for applying the former potential to the anode of said diode vacuum tube.

2. The combination comprising a source of periodic peaked voltage, an energy storage circuit including a capacitor and a diode vacuum tube connected in series, means connecting the anode of said diode vacuum tube to said source of voltage, a cathode follower vacuum tube having its input electrode connected to the cathode of said diode vacuum tube, a vacuum tube arranged to be energized from said cathode follower vacuum tube, said latter vacuum tube having an anode resistor for developing a voltage drop approximately equivalent to the biasing voltage impressed upon the cathode follower vacuum tube, means for applying said voltage drop to the anode of said diode vacuum tube, and a rapid discharging circuit for said capacitor including a normally non-conductive grid-controlled tube.

3. The combination comprising a source of periodic peaked voltage, an energy storage circuit including a capacitor and a diode vacuum tube connected in series, means connecting the anode of said diode vacuum tube to said source of voltage, a cathode follower vacuum tube having its input electrode connected to the cathode of said diode, a vacuum tube and a load resistor therefor connected to be controlled by said cathode follower vacuum tube to develop a potential proportional to the potential appearing across said capacitor, means for applying said potential to the anode of said diode vacuum tube, a rapid discharge circuit for said capacitor including a normally non-conductive grid-controlled tube, and a control circuit connected between the control grid of said latter tube and the anode of said diode vacuum tube, said control circuit including means for rendering the last-named tube conductive when the anode potential of said diode reaches a certain value.

4. The combination comprising a source of periodic peaked voltage, an energy storage circuit including a capacitor and a diode vacuum tube having its cathode connected to said capacitor, means connecting the anode of said diode vacuum tube to said source of voltage, means for developing a potential proportional to the voltage appearing across said capacitor, means for applying said developed potential to the anode of said diode vacuum tube to simultaneously increase the potential thereof whereby successive pulses of said periodic voltage will increase the potential across said capacitor by substantially equal increments, an output circuit including a diode rectifier having its anode connected to the anode of said first mentioned diode vacuum tube, a rapid discharging circuit for said capacitor including a normally non-conductive grid-controlled tube, and means for controlling the conductivity of said latter tube in accordance with a potential appearing across said output circuit.

5. The combination comprising a blocking oscillator arranged to be energized in accordance with periodic voltage, an energy storage circuit including a capacitor and a diode vacuum tube connected in series, means for supplying energy from said blocking oscillator to said circuit, means for dissipating energy received from said blocking oscillator in excess of a predetermined value whereby said capacitor will be charged by equal periodic increments, means for developing a potential proportional to the voltage appearing across said capacitor, means for supplying said developed potential to the anode of said diode vacuum tube, an output circuit arranged to be responsive to said energy storage circuit including a diode vacuum tube having its anode connected to the anode of said first mentioned vacuum tube, a second blocking oscillator, means for controlling said second blocking oscillator in accordance with the potential supplied by said second diode vacuum tube, a rapid discharging circuit for said capacitor including a normally non-conductive grid-controlled tube, and a control circuit for said latter tube arranged to be responsive to the energization of said second blocking oscillator thereby to render the last-named tube conductive and to discharge said capacitor.

6. In an impulse counter, a source of pulses to be counted, a first condenser coupled to said impulse source, a second condenser coupled to said first condenser for the transfer of pulses from said first condenser to said second condenser, means for preventing flow of energy from said second condenser to said first condenser, a source of variable voltage including a controlling input circuit and a controlled output circuit, means coupling said second condenser to said input circuit to produce in said output circuit a voltage varying in correspondence with variations in the voltage of said second condenser, and means coupling said output circuit to said first condenser for varying the potential of said first condenser in accordance with variations in the voltage of said second condenser whereby the voltage across said second condenser increases by substantially equal increments.

7. In an impulse counter, a charging condenser and a storage condenser coupled together, a source of pulses coupled to said charging condenser, means for preventing flow of energy from said storage condenser to said charging condenser, a vacuum tube having an input circuit and an output circuit, means coupling said input circuit to one of said condensers for varying the conductivity of said tube in response to said impulses, means in said output circuit responsive to the varying conductivity of said tube for developing a boosting potential, and means coupling said output circuit to said charging condenser for impressing said boosting potential upon said charging condenser.

8. The combination comprising a source of periodic peaked voltage, an energy storage circuit including a capacitor and a diode vacuum tube connected in series, means connecting the anode of said diode vacuum tube to said source of voltage, a rapid discharging circuit for said capacitor, a cathode follower tube having its input electrode connected to the cathode of said diode vacuum tube, a vacuum tube arranged to be energized from said cathode follower tube for developing a potential substantially equal to the potential appearing across said capacitor, and means for applying the former potential to the anode of said diode vacuum tube.

9. In an impulse counter, a source of pulses to be counted, a first condenser coupled to said impulse source, a second condenser coupled to said first condenser for the transfer of pulses from said first condenser to said second condenser, means for preventing flow of energy from said second condenser to said first condenser, a source of variable voltage including a controlling input circuit and a controlled output circuit, means coupling said second condenser to said input circuit to produce, in said output circuit, a voltage varying in correspondence with variations in the voltage of said second condenser, and means coupling said output circuit to said first condenser for varying the potential of said first condenser in accordance with variations in the voltage of said second condenser whereby the voltage across said second condenser changes by substantially equal amounts.

10. In an impulse counter, a charge transfer condenser and a storage condenser coupled together, a source of pulses coupled to said charge transfer condenser, means for preventing flow of energy from said storage condenser to said charge transfer condenser, a vacuum tube having an input circuit and an output circuit, means coupling said input circuit to one of said condensers for varying the conductivity of said tube in response to said impulses, means in said output circuit responsive to the varying conductivity of said tube for developing a compensating potential, and means coupling said output circuit to said charge transfer condenser for impressing said compensating potential upon said charge transfer condenser.

11. In an impulse counter, a source of pulses to be counted, a first condenser coupled to said impulse source, a second condenser coupled to said first condenser for the transfer of pulses from said first condenser to said second condenser, means for preventing flow of energy from said second condenser to said first condenser, a source of variable voltage including a controlling input circuit and an output circuit adapted to be varied in approximate proportion to variations in said input circuit, means coupling said second condenser to said input circuit to produce in said output circuit a voltage varying in approximate correspondence with variations in the voltage of said second condenser, a non-linear resistive element in said output circuit for improving the fidelity with which variations in said output circuit follow variations in said input circuit, and means connected to said non-linear resistive element and coupling said output circuit to said first condenser for varying the potential of said first condenser in accordance with variations in the voltage of said second condenser whereby the voltage across said second condenser increases by substantially equal increments.

12. In an impulse counter, a charging condenser and a storage condenser coupled together, a source of pulses coupled to said charging condenser, means for preventing flow of energy from said storage condenser to said charging condenser, a vacuum tube having an input circuit and an output circuit, means coupling said input circuit to one of said condensers for varying the conductivity of said tube in response to said impulses in a non-linear relation, means in said output circuit responsive to the varying conductivity of said tube for developing a boosting potential which is approximately proportional to the potential of said one condenser, a non-linear resistive element in said output circuit for improving the fidelity with which said boosting potential follows variations of said condenser potential, and means coupling the boosting potential from said output circuit to said charging condenser for impressing said boosting potential upon said charging condenser.

13. In an impulse counter, a source of pulses to be counted, a first condenser coupled to said impulse source, a second condenser coupled to said first condenser for the transfer of pulses from said first condenser to said second condenser, a diode vacuum tube connected between said condensers for preventing flow of energy from said second condenser to said first condenser, a source of variable voltage including a controlling input circuit and a controlled output circuit, means coupling said second condenser to said input circuit to produce, in said output circuit, a voltage varying in correspondence with variations in the voltage of said second condenser, and means coupling said output circuit to said first condenser for varying the potential of said first condenser in accordance with variations in the voltage of said second condenser whereby the voltage across said second condenser changes by substantially equal amounts.

14. In an impulse counter, a charge transfer condenser and a storage condenser coupled together, a source of pulses coupled to said charge transfer condenser, a diode vacuum tube connected between said condensers for preventing flow of energy from said storage condenser to said charge transfer condenser, a vacuum tube having an input circuit and an output circuit, means coupling said input circuit to one of said condensers for varying the conductivity of said tube in response to said impulses, means in said output circuit responsive to the varying conductivity of said tube for developing a compensating potential, and means coupling said output circuit to said charge transfer condenser for impressing said compensating potential upon said charge transfer condenser.

CLIFFORD C. HOAGLAND.

REFERENCES CITED

The following references are of record in the file of this patent:

UNITED STATES PATENTS

| Number | Name | Date |
|---|---|---|
| 2,113,011 | White | Apr. 5, 1938 |
| 2,195,996 | Palmer | Apr. 2, 1940 |
| 2,365,583 | Nagel | Dec. 19, 1944 |
| 2,413,440 | Farrington | Dec. 31, 1946 |

FOREIGN PATENTS

| Number | Country | Date |
|---|---|---|
| 566,200 | Great Britain | Dec. 19, 1944 |